US006636080B2

(12) United States Patent
Soda

(10) Patent No.: US 6,636,080 B2
(45) Date of Patent: Oct. 21, 2003

(54) APPARATUS FOR DETECTING EDGES OF INPUT SIGNAL TO EXECUTE SIGNAL PROCESSING ON THE BASIS OF EDGE TIMINGS

(75) Inventor: Masaaki Soda, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/002,059

(22) Filed: Oct. 26, 2001

(65) Prior Publication Data

US 2002/0050842 A1 May 2, 2002

(30) Foreign Application Priority Data

Oct. 31, 2000 (JP) .................................... 2000-333943

(51) Int. Cl.$^7$ ................................................ H03K 5/22
(52) U.S. Cl. ................................................ 327/24; 327/26
(58) Field of Search ........................ 327/18, 23, 24, 327/25, 26, 27, 28, 29, 30, 31, 35–38, 170, 172, 291–293, 295, 296

(56) References Cited

U.S. PATENT DOCUMENTS

| | | | |
|---|---|---|---|
| 5,208,839 A | * 5/1993 | Hladik et al. | ............... 375/110 |
| 5,229,668 A | 7/1993 | Hughes, Jr. et al. | .......... 327/91 |
| 5,294,844 A | 3/1994 | Motoike | ....................... 327/91 |
| 5,297,869 A | 3/1994 | Benham | ..................... 375/110 |
| 5,315,627 A | 5/1994 | Draving | ........................ 377/20 |
| 5,327,092 A | 7/1994 | Inogai et al. | ............... 328/167 |
| 5,892,474 A | 4/1999 | Sugawara | ................... 341/200 |
| 6,130,577 A | 10/2000 | Tamba et al. | ............... 329/304 |

FOREIGN PATENT DOCUMENTS

| | | |
|---|---|---|
| JP | 1-260915 | 10/1989 |
| JP | 4-13325 | 1/1992 |
| JP | 8-154053 | 6/1996 |
| JP | 8-321827 | 12/1996 |
| JP | 9-149018 | 6/1997 |
| JP | 09261212 A | 10/1997 |
| JP | 2001-136157 | 5/2001 |

\* cited by examiner

Primary Examiner—My-Trang Nuton
(74) Attorney, Agent, or Firm—Scully, Scott, Murphy & Presser

(57) ABSTRACT

An apparatus for detecting an edge timing of an input signal and operating on the basis of the edge timing while power consumption thereof is reduced. The apparatus includes an edge detecting circuit that detects edges of an input signal to generate an edge timing representing signal representative of edge timings of the edges, a signal processing circuit responsive to the edge timing representing signal. The edge detection circuit outputs an enable signal to enable the signal processing circuit to operate when the edge detection circuit finds one of the edges. The signal processing circuit executes a signal processing of the edge timing representing signal in response to the enable signal.

13 Claims, 11 Drawing Sheets

APPARATUS FOR DETECTING EDGES OF INPUT SIGNAL TO EXECUTE SIGNAL PROCESSING ON THE BASIS OF EDGE TIMINGS

BACKGROUND OF THE INVENTION

1. Field of the Invention

The present invention relates to an apparatus. More particularly, the present invention relates to an apparatus for detecting edges of an input signal to executes signal processing on the basis of edge timings.

2. Description of the Related Art

Edge detecting circuits are widely used for various signal processing. An edge detecting circuit is disclosed in Japanese Laid Open Patent Application (JP-A-2001 136157). The entire disclosure of the corresponding U.S. patent application Ser. No. 09/699,245, filed Oct. 27, 2000 is hereby incorporated herein in its entirety by reference. The edge detecting circuit is used in a clock signal reproducing apparatus. The clock signal reproducing apparatus is composed of a detecting circuit and a clock signal outputting circuit. The detecting circuit detects edge timings of an input signal at which the input signal is inverted. The detecting circuit quantizes the detected edge timings to a predetermined number of states. The clock signal outputting circuit outputs an outputted clock signal. A phase of the outputted clock signal is established based on the edge timings.

Another edge detecting circuit for surely detecting edges of signals is disclosed in Japanese Laid Open Patent Application (JP-A-Heisei 1-260915). As shown in FIG. 1, the conventional apparatus includes flip-flop circuits 101–104, inverters 105, 106, delay circuits 107–110, XOR gates 111–114, an OR gate 115 and an address decoder 116. The conventional apparatus detects that address signals 120, 121 are changed from the High level to the Low level or from the Low level to the High level.

When the address signal 120 is changed from the Low level to the High level as shown in FIG. 2, the flip-flop circuit 101 detects the change to generate an output pulse. Next, when the address signal 120 is changed from the High level to the Low level, the flip-flop circuit 102 detects the change. In the conventional edge detecting circuit, even if the change to the High level from the Low level is done in the time shorter than the predetermined delay time $T_W$, a sure edge detection signal is inputted to an enable terminal of the address decoder 116 without any separation of the output pulse.

However, the conventional edge detecting circuit does not output a signal indicating edge timings of the address signals 120, 121. The conventional edge detecting circuit merely detects that the address signals 120, 121 are changed from the High level to the Low level, or from the Low level to the High level, and only sets the address decoder 116 enable.

Also, a synchronizing circuit including an edge detecting circuit is disclosed in Japanese Laid Open Patent Application (JP-A-Heisei 4-13325). The synchronizing circuit receives a data signal, synchronizes an interior clock signal with the data signal, and samples the data signal with the synchronized clock signal. In detail, the synchronizing circuit includes a data signal edge detecting circuit, a clock signal edge detecting circuit, a synchronization judging circuit, and a clock signal selecting circuit. The data signal edge detecting circuit outputs a data signal edge detection pulse when detecting an edge of the data signal. The clock signal edge detecting circuit outputs a clock signal edge detection pulse when detecting an edge of the clock signal. The synchronization judging circuit superposes the data signal edge detection pulse and the clock signal edge detection pulse to output an asynchronous state detection pulse. The clock signal is responsive to asynchronous state detection pulse for selecting one of clock signals having different phases to output it as the interior clock signal. However, the edge timing of the data signal is not detected in the synchronizing circuit and the operation of the synchronizing circuit is not based on the edge timing.

SUMMARY OF THE INVENTION

An object of the present invention is to provide an apparatus for detecting an edge timing and operating on the basis of the edge timing while power consumption thereof is reduced.

Another object of the present invention is to provide an apparatus for detecting an edge timing and operating on the basis of the edge timing while the operation thereof is stabilized.

In order to achieve an aspect of the present invention, an apparatus includes an edge detecting circuit that detects edges of an input signal to generate an edge timing representing signal representative of edge timings of the edges, a signal processing circuit responsive to the edge timing representing signal. The edge detection circuit outputs an enable signal to enable the signal processing circuit to operate when the edge detection circuit finds one of the edges. The signal processing circuit executes a signal processing of the edge timing representing signal in response to the enable signal.

The edge detecting circuit preferably quantizes the edge timings to represent the edge timings in the edge timing representing signal.

The enable signal preferably consists of rectangular pulses having a pulse width larger than a predetermined value.

The edge detection circuit preferably detects the edges in synchronization with a clock signal, and the pulse width is larger than a cycle of the clock signal.

The edge detection circuit preferably generates the enable signal based on the edge timing representing signal.

The edge detection circuit preferably changes a state of the edge timing representing signal is changed only when the edge detection detects the edges.

The edge detecting circuit preferably includes a plurality of sampling circuits each of which is responsive to one of clock signals for sampling the input signal in synchronization with the one of the clock signals to generate a sample signal, the clock signals having different phases each other, and an edge timing determining circuit generates the edge timing representing signal based on the sample signals received from the plurality of sampling circuits, the edge timing determining circuit determining the edge timings on the basis of whether or not two of the sample signals indicate different values.

In order to achieve another aspect of the present invention, a clock signal reproducing circuit includes an edge detecting circuit which detects edges of an input signal to generate an edge timing representing signal representative of edge timings of the edges, a clock signal outputting circuit responsive to the edge timing representing signal for generating another clock signal synchronized with the input signal. The edge detection circuit outputs an enable signal to enable the clock signal outputting circuit to operate when the edge detection circuit finds one of the edges.

The clock signal outputting circuit preferably selects one of a plurality of clock signals having different phases each other on the basis of the edge timing representing signal and output the one of the plurality of clock signals as the another clock signal.

In the case when the edges have a present edge which is latest of the edges, and a past edge detected before the present edge, the clock signal outputting circuit preferably includes a memorizing circuit memorizing a past edge timing of the past edge, the another clock signal is outputted on the basis of edge timings of the present edge and the past edge.

In order to achieve still another aspect of the present invention, a signal reproducing circuit includes an edge detecting circuit which detects edges of an input signal to generate an edge timing representing signal representative of edge timings of the edges, a clock signal outputting circuit responsive to the edge timing representing signal for generating another clock signal synchronized with the input signal, and a reproduced signal outputting circuit sampling the input signal with the another clock signal to output a reproduced signal. The edge detection circuit outputs an enable signal to enable the clock signal outputting circuit to operate when the edge detection circuit finds one of the edges.

In order to achieve yet still aspect of the present invention, a method of operating an apparatus includes:

detecting edges of an input signal;

outputting an edge timing representing signal representative of edge timings of the edges;

outputting an enable signal when one of the edges is detected; and enabling a circuit to operate in response to the edge timing representing signal.

The circuit preferably outputs a clock signal synchronized with the input signal on the basis of the edge timings.

DESCRIPTION OF THE PREFERRED EMBODIMENTS

Embodiments according to the present invention will be described below with reference to the attached drawings.

First Embodiment

An apparatus in a first embodiment is a clock signal reproducing apparatus. The apparatus generates a clock signal synchronous with an input signal which has waveform thereof distorted through a communication link. The apparatus also samples the input signal at the clock signal, and reproduces the waveform of the input signal. The configuration of the apparatus will be described below.

Figure 1:
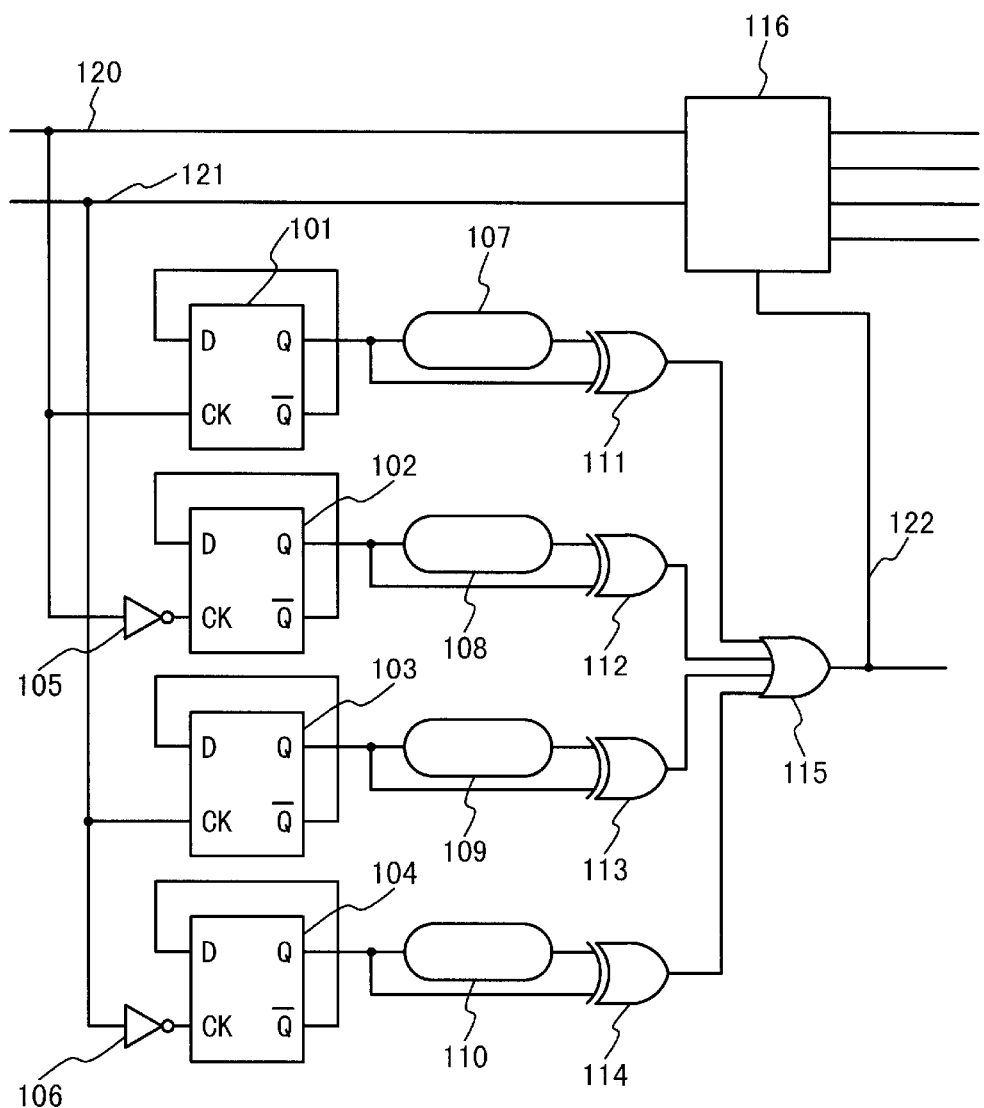
FIG. 1 shows a configuration of a conventional edge detection circuit.
Figure 2:
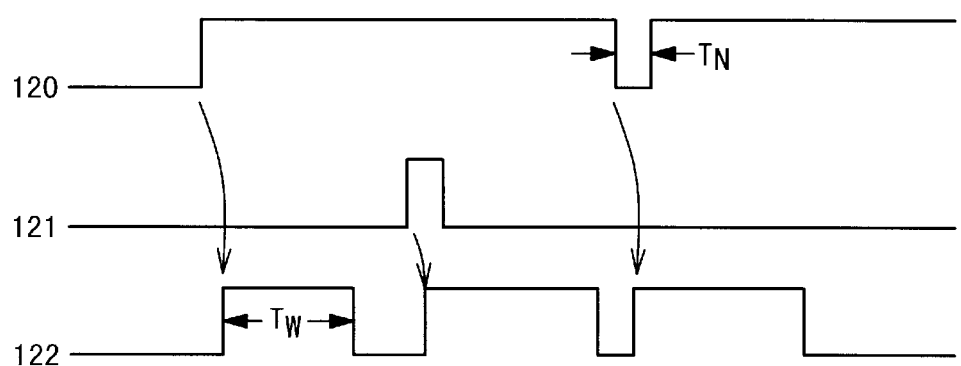
FIG. 2 is a timing chart showing an operation of the conventional edge detection circuit.
Figure 3:
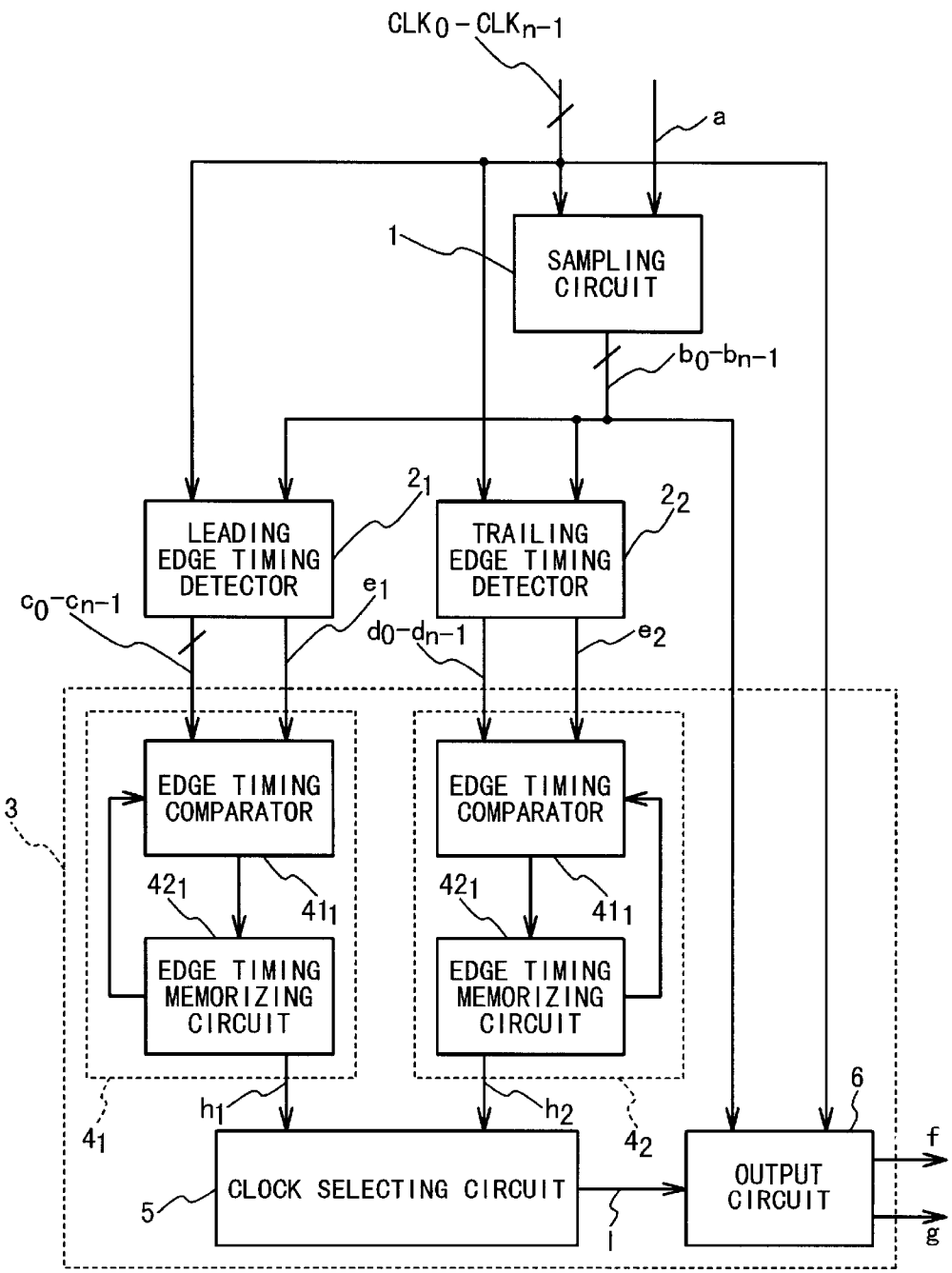
FIG. 3 shows a configuration of an apparatus of a first embodiment according to the present invention.

FIG. 3 shows the apparatus in the first embodiment. The apparatus includes a sampling circuit 1, a leading edge timing detector $2_1$ and a trailing edge timing detector $2_2$.

The sampling circuit 1 is triggered by n clock signals $CLK_0$–$CLK_{n-1}$ having different phases to sample an input signal a. In the embodiment, n=8. The sampling circuit 1 outputs sample data signals $b_0$–$b_{n-1}$ which is representative of the data of input signal a and synchronous to the clock signals $CLK_0$–$CLK_{n-1}$.

The leading edge timing detector $2_1$ detects a leading edge timing of the input signal a, on the basis of the sample data signals $b_0$–$b_{n-1}$ to generate leading edge timing signals $c_0$–$c_{n-1}$ indicative of the detected leading edge timing. Moreover, the leading edge timing detector $2_1$ detects an leading edge of the input signal a on the basis of the sample data signals $b_0$–$b_{n-1}$ to set an edge detection signal $e_1$ to the High level for a certain time.

The trailing edge timing detector $2_2$ carries out the operation similar to that of the leading edge timing detector $2_1$ except the operation for detecting the trailing edge timing of the input signal a. The trailing edge timing detector $2_2$ detects the trailing edge timing of the input signal a on the basis of the sample data signals $b_0$–$b_{n-1}$ to generate leading edge timing signals $d_0$–$d_{n-1}$ indicative of the detected leading edge timing. Moreover, the leading edge timing detector $2_1$ detects the trailing edge of the input signal a to set an edge detection signal $e_2$ to the High level for a certain time.

The leading edge timing signals $c_0$–$c_{n-1}$ the trailing edge timing signals $d_0$–$d_{n-1}$ and the edge detection signals $e_1$, $e_2$ are outputted to a signal reproducing circuit 3.

The signal reproducing circuit 3 is enabled by the edge detection signals $e_1$, and captures the leading edge timing signals $c_0$–$c_{n-1}$ when the edge detection signal $e_1$ is changed from the Low level to the High level. Moreover, the signal reproducing circuit 3 is enabled by the edge detection signal $e_2$, and captures the trailing edge timing signals $d_0$–$d_{n-1}$ when the edge detection signal $e_2$ is changed from the Low level to the High level. The signal reproducing circuit 3 selects a clock signal which is in the most synchronous state with the input signal a from the clock signals $CLK_0$–$CLK_{n-1}$ on the basis of the leading edge timing of the input signal a indicated by the leading edge timing signals $c_0$–$c_{n-1}$ and the trailing edge timing of the input signal a indicated by the trailing edge timing signals $d_0$–$d_{n-1}$. Then the signal reproducing circuit 3 outputs the selected clock signal as a selection clock signal f. Moreover, the signal reproducing circuit 3 outputs one of the sample data signals $b_0$ to $b_{n-1}$ as a data reproduction signal g, which corresponds to a signal generated by sampling the input signal a with the selection clock signal f.

In the apparatus, the signal reproducing circuit 3 is enabled by the edge detection signals $e_1$, $e_2$ when the leading edge and the trailing edge of the input signal a are detected. When the leading edge and the trailing edge in the input signal a are detected, the signal reproducing circuit 3 is enabled to operate. When the leading edge and the trailing edge in the input signal a are not detected, the signal reproducing circuit 3 does not operate. This suppresses the consumption of the electric power of the apparatus.

The apparatus of the embodiment will be described below in detail.

The clock signals $CLK_0$ to $CLK_{n-1}$ are inputted to the sampling circuit 1. The clock signals $CLK_0$ to $CLK_{n-1}$ have the same cycle T and the same pulse width $T_W$ while their phases are different from each other. The phase of the clock signal $CLK_i$ is delayed by $2\pi i/n$ from the clock signals $CLK_0$. Here, i is an integer between 0 and n−1. The sampling circuit 1 uses the clock signals $CLK_0$–$CLK_{n-1}$ for sampling the input signals a.

In this specification, the phase is defined as 0 at a time when the clock signal $CLK_0$ rises from the Low level to the High level. According to this definition, the clock signal $CLK_i$, whose phase is delayed by $2\pi i/n$ from the clock signal $CLK_0$, is pulled from the Low level up to the High level at a time when the phase is at $2\pi i/n$.

Figure 4:
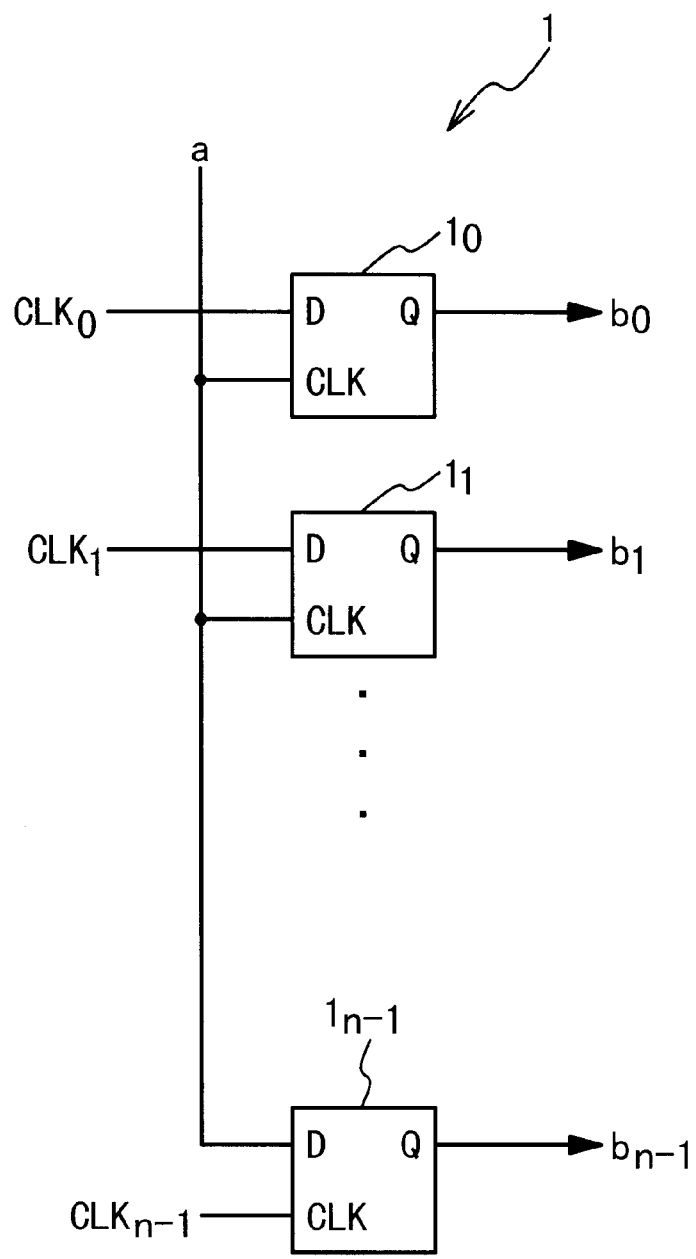
FIG. 4 shows a configuration of a sampling circuit 1.

FIG. 4 shows the configuration of the sampling circuit 1. The sampling circuit 1 includes D-flip-flops $1_0$–$1_{n-1}$. The input signal a is inputted to each of the D-flip-flops $1_0$–$1_{n-1}$. Moreover, the clock signals $CLK_0$ to $CLK_{n-1}$ are inputted to the D-flip-flops $1_0$–$1_{n-1}$, respectively. The D-flip-flops $1_0$–$1_{n-1}$ respectively use the clock signals $CLK_0$–$CLK_{n-1}$ for sampling the input signal a, and then output the sample signals $b_0$–$b_{n-1}$, respectively. The sample signals $b_0$–$b_{n-1}$ are outputted to the leading edge timing detector $2_1$ and the trailing edge timing detector $2_2$.

As mentioned above, the leading edge timing detector $2_1$ detects the leading edge timings of the input signal a, on the basis of the sample signals $b_0$ to $b_{n-1}$.

The leading edge timings detected by the leading edge timing detector $2_1$ are quantized to n states and represented by the integer between 0 and n−1. Here, the fact that the leading edge timing of the input signal a is at i implies that the input signal a is pulled up to the High level between a time when the phase is at $2\pi i/n$ and a time when the phase is at $2\pi(i+1)/n$. Here, i is the integer between 0 and n−1. For example, let us suppose a case of i=0. The fact that the leading edge timing is at 0 implies that the input signal a rises between a time when the phase is at 0 and a time when the phase is at $2\pi/n$. Similarly, the fact that the leading edge timing is at 1 implies that the input signal a rises between a time when the phase is at $2\pi/n$ and a time when the phase is at $2\pi \times 2/n$. Here, the fact that the phase is at $2\pi \times n/n$ is equivalent to the fact that the phase is at 0. That is, the fact that the leading edge timing is at n−1 implies that the input signal a rises between a time when the phase is at $2\pi \times n-1/n$ and a time when the phase is at 0.

The state that the leading edge timing signal $c_i$ is at the High level indicates the leading edge timing is at i. Here, i is the integer between 0 and n−1. That is, the leading edge timing signals $c_0$–$c_{n-1}$ outputted by the leading edge timing detector $2_1$ indicate the leading edge timing of the input signal a. The leading edge timing signals $c_0$–$c_{n-1}$ are allowed to have a state that all of them are at the Low level or a state that only one of them is at the High level.

Figure 5:
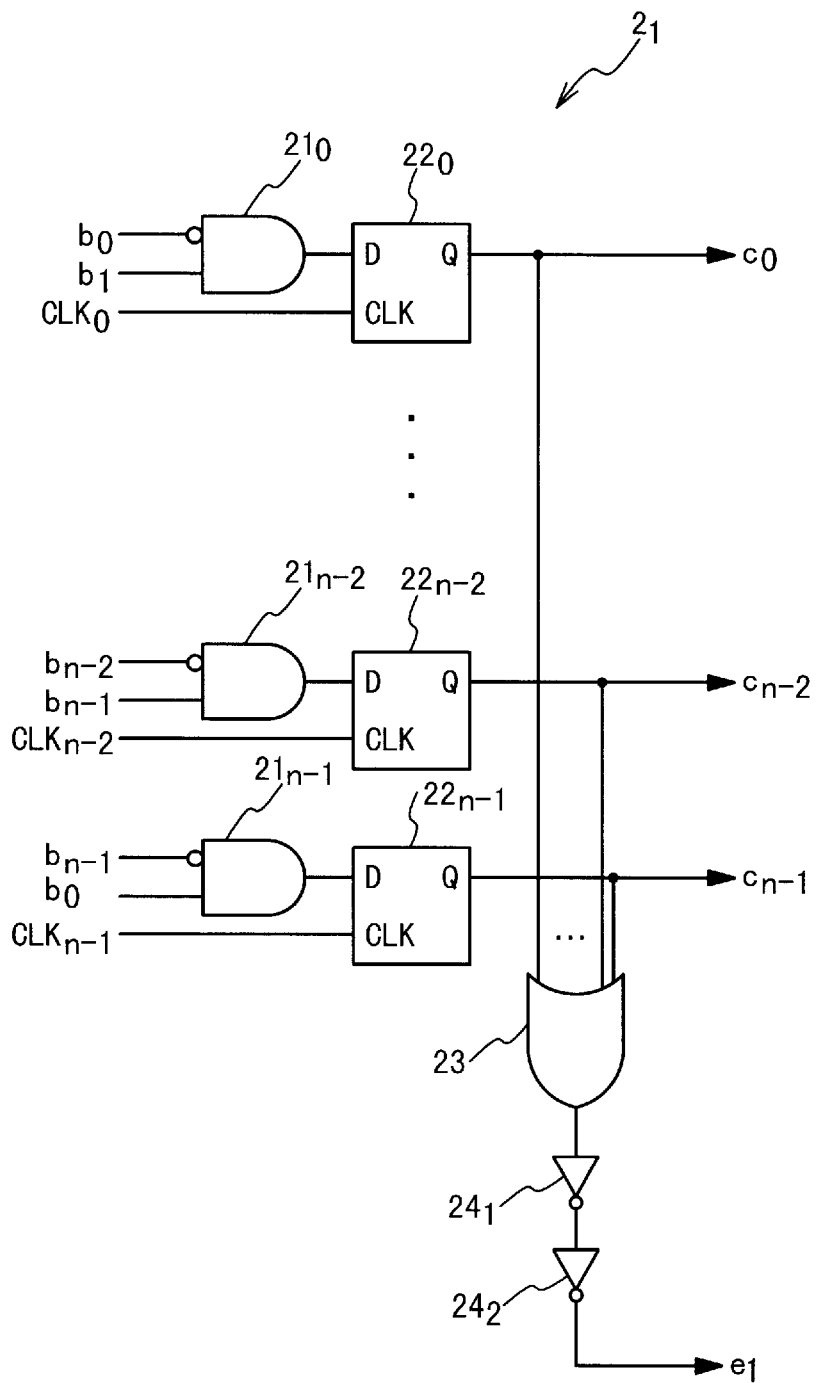
FIG. 5 shows a configuration of a leading edge position detection circuit $2_1$.
Figure 6:
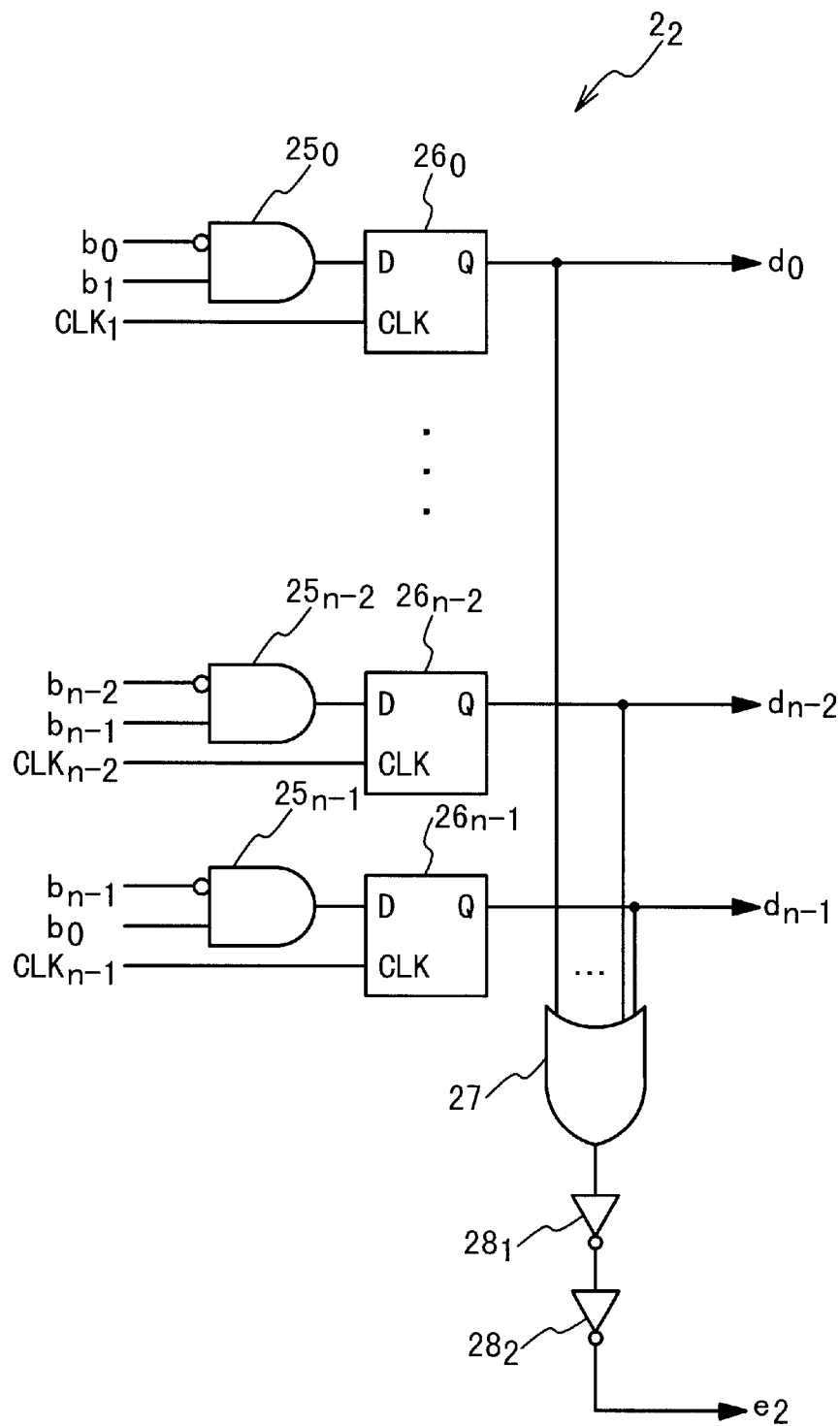
FIG. 6 shows a configuration of a trailing edge position detection circuit $2_2$.

FIG. 5 shows the leading edge timing detector $2_1$ for generating the leading edge timing signals $c_0$–$c_{n-1}$. The leading edge timing detector $2_1$ is provided with AND gates $21_0$–$21_{n-1}$, D-flip-flops $22_0$–$22_{n-1}$, an OR gate 23, and inverters $24_1$, $24_2$.

The sample signal $b_{i+1}$ and an inverse of the sample signal $b_i$ are inputted to the AND gate $21_i$. Here, i is the integer between 0 and n−1. For example, for i being 0, the sample signal $b_1$ and the inverse of the sample signal $b_0$ are inputted to the AND gate $21_0$. However, it should be understood that the sample signal $b_n$ means the sample signal $b_0$. That is, the sample signal $b_0$ and the inverse of the sample signal $b_{n-1}$ are inputted to the AND gate $21_{n-1}$. The output of the AND gate $21_i$ becomes at the High level when the input signal a rises from the Low level to the High level between a time when the phase is at $2\pi i/n$ and a time when the phase is at $2\pi(i+1)/n$. The outputs of the AND gates $21_0$–$21_{signal\ c0}$ indicates the AND of an inverse of the sample signal $b_0$ and the sample signal $b_1$, and After the clock signal $CLK_0$ is pulled up to the High level, the leading edge timing signal $c_0$ is kept at the Low level.

Similarly, the leading edge timing signals $c_1$–$c_6$ are kept at the Low level after the rises of the respective clock signals $CLK_1$ to $CLK_6$.

On the other hand, immediately before the rise of the clock signal $CLK_7$, the sample signals $b_7$, $b_0$ are at the Low level and the High level, respectively. The leading edge timing signal $c_7$ indicates the AND of the sample signal $b_0$ and an inverse of the sample signal $b_7$. Thus, the leading edge timing signal $c_7$ is changed from the Low level to the High level at the time of the rise of the clock signal $CLK_7$.

In this way, the leading edge timing signals $c_0$–$c_6$ become at the Low level, and the leading edge timing signal $c_7$ becomes at the High level. This implies that the leading edge timing of the input signal a is detected as 7. In this way, the leading edge timing of the input signal a is detected as 7 (=n−1) by the sampling circuit 1 and the leading edge timing detector $2_1$.

The data detection signal $e_1$, which indicates the OR of the leading edge timing signals $c_0$–$c_7$, is pulled up to the High level, in response to the pull-up of the leading edge timing signal $c_7$. The timing when the data detection signal $e_1$ is pulled up to the High level is delayed by a certain time. This delay time is caused by the OR gate 23 and the inverters $24_1$, $24_2$ shown in FIG. 5. The inverters $24_1$, $24_2$ are used for generating the delay time.

The delay time optimizes the timing when the data detection signal $e_1$ is pulled up to the High level for the capture of the leading edge timing signals $c_0$–$c_7$. As described later, the signal reproducing circuit 3 captures the leading edge timing signals $c_0$–$c_7$ when the data detection signal $e_1$ is changed to the High level. The delay in the data detection signal $e_1$ ensures the capture of the leading edge timing signals $c_0$–$c_7$.

The data detection signal $e_1$ is designed not to return to the Low level within at least a time shorter than the period T of the clock signals $CLK_0$ to $CLK_7$ once the data detection signal $e_1$ is pulled up to the High level. That is, a pulse width of a rectangular pulse contained in the data detection signal $e_1$ is always equal to or longer than the period T of the clock signals $CLK_0$ to $CLK_7$. The reason is as follows. The leading edge timing signals $c_0$–$c_7$ on which the data detection signal $e_1$ is generated, are never changed to the Low level within the time equal to the period T of the clock signals $CLK_0$–$CLK_7$, once the leading edge timing signals $c_0$–$c_7$ are changed to the High level. The states of the leading edge timing signals $c_0$–$c_7$ are changed only for the respective rises of the clock signals $CLK_0$ to $CLK_7$. Thus, once the leading edge timing signals $c_0$–$c_7$ are changed to the High level, the leading edge timing signals $c_0$–$c_7$ are never pulled down to the Low level within the time shorter than the period T of the clock signals $CLK_0$ to $CLK_7$.

The pulse width equal to or longer than the period T of the clock signals $CLK_0$–$CLK_7$ contributes to the stable operation of the apparatus in the embodiment.

Figure 7:
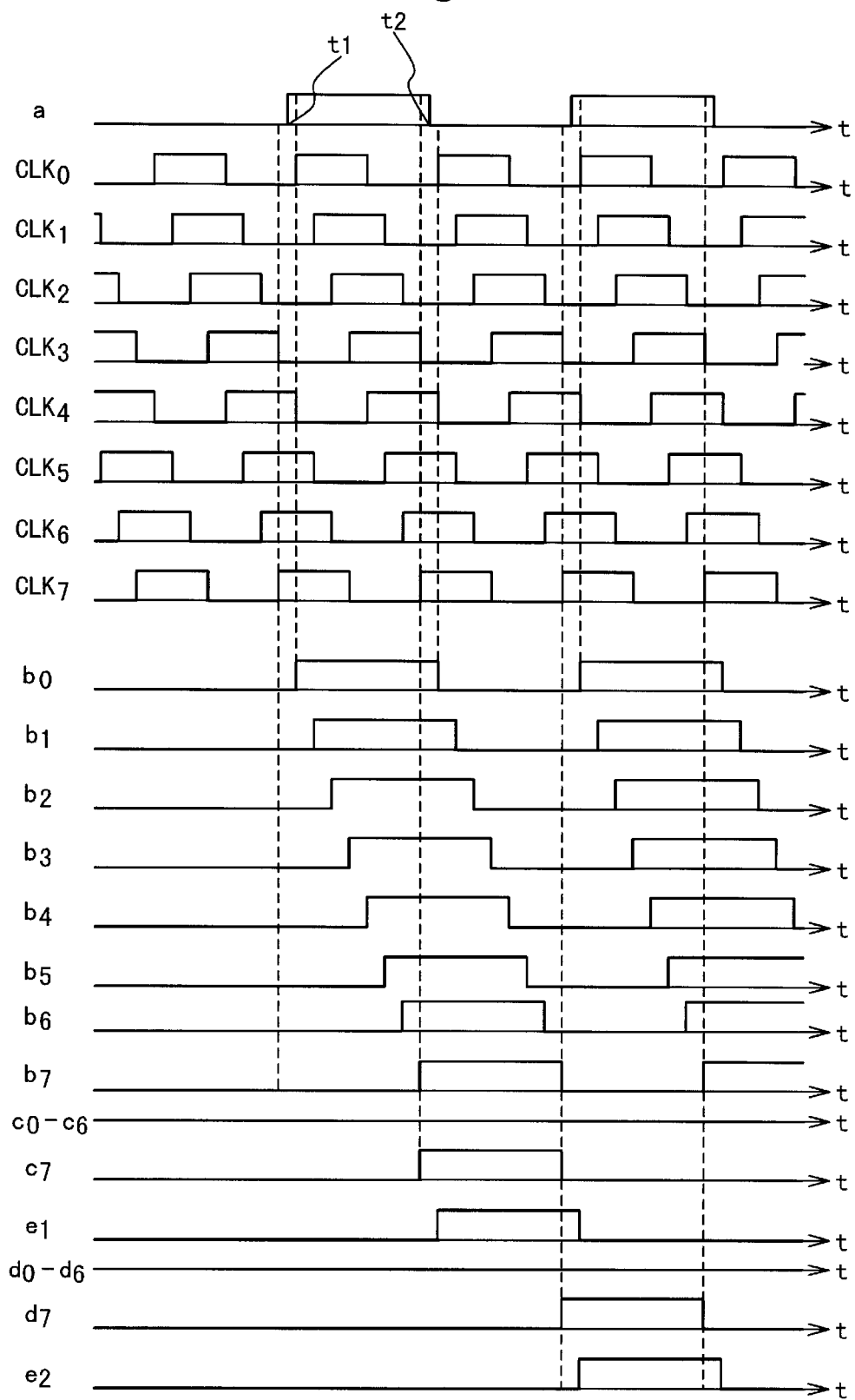
FIG. 7 is a timing chart showing the operations of the sampling circuit 1, the leading edge position detection circuit $2_1$ and the trailing edge position detection circuit $2_2$.

As shown in FIG. 7, it is assumed that the input signal a, which rises from the Low level to the High level at the time $t_1$, is pulled down to the Low level at a time $t_2$. The time $t_2$ is the time between the time when the clock signal $CLK_7$ rises and the time when the clock signal $CLK_0$ rises. That is, the time $t_2$ is the time between the time when the phase is at $2\pi \times 7/8$ (=$2\pi(n-1)/n$) and the time when the phase is at 0. The trailing edge timing of the input signal a is detected as 7 (=n−1) by the sampling circuit 1 and the trailing edge timing detector $2_2$. The process of the detection of the trailing edge timing is equal to the above-mentioned process in which the leading edge timing of the input signal a is detected as 7 (=n−1).

The trailing edge timing detector $2_2$ keeps the trailing edge timing signals $d_0$–$d_6$ at the Low level, and pulls the trailing edge timing signal $d_7$ up to the High level when the clock signal $CLK_7$ rises. That is, the trailing edge timing detector $2_2$ detects the trailing edge timing of the input signal a as 7 (=n−1).

Moreover, the trailing edge timing detector $2_2$ pulls up a data detection signal $e_2$ to the High level at a timing that is delayed by a certain delay time from a timing when the trailing edge timing signal $d_7$ is changed to the High level. The pulse width of the data detection signal $e_2$ is equal to or longer than the period T of the clock signals $CLK_0$ to $CLK_7$ from the same reason of the data detection signal $e_1$.

The leading edge timing signals $c_0$–$c_{n-1}$, the edge detection signal $e_1$, the trailing edge timing signals $d_0$–$d_{n-1}$, and the edge detection signal $e_2$ are inputted to the signal reproducing circuit 3.

As shown in FIG. 3, the signal reproducing circuit 3 includes a most likely leading edge timing calculator $4_1$, a most likely trailing edge timing calculator $4_2$, a clock selection circuit 5 and an output circuit 6. The most likely leading edge timing calculator $4_1$ includes an edge timing comparator $41_1$ and an edge memory circuit $42_1$. The most likely trailing edge timing calculator $4_2$ includes an edge timing comparator $41_2$ and an edge memory circuit $42_2$.

The most likely leading edge timing calculator $4_1$ determines the most likely edge timing which is most likely for the leading edge timing of the input signal a, on the basis of the latest leading edge timing detected by the leading edge timing detector $2_1$.

The latest leading edge timing detected by the leading edge timing detector $2_1$ is easily affected by noise and jitter on the input signal a. Even if the leading edge timing detector $2_1$ detects the rapid change in the leading edge timing, it may result from the noise and the jitter.

In order to reduce the influence of the noise and the jitter, the most likely leading edge timing calculator $4_1$ carries out the following operation. The most likely leading edge timing of the input signal a is stored in the edge memory circuit $42_1$. The edge timing comparator $41_1$ compares the stored most likely leading edge timing with the latest leading edge timing detected by the leading edge timing detector $2_1$. Then, the most likely leading edge timing is gradually adjusted. The most likely leading edge timing is sent to the clock selection circuit 5 by using a most likely leading edge timing signal $h_1$.

The most likely leading edge timing calculator $4_1$ determines the most likely leading edge timing only when the edge detection signal $e_1$ is changed from the Low level to the High level. That is, the most likely leading edge timing calculator $4_1$ determines the most likely leading edge timing only when the leading edge is detected from the input signal a. Such the operation suppresses the consumption of the electric power in the most likely leading edge timing calculator $4_1$.

Figure 8:
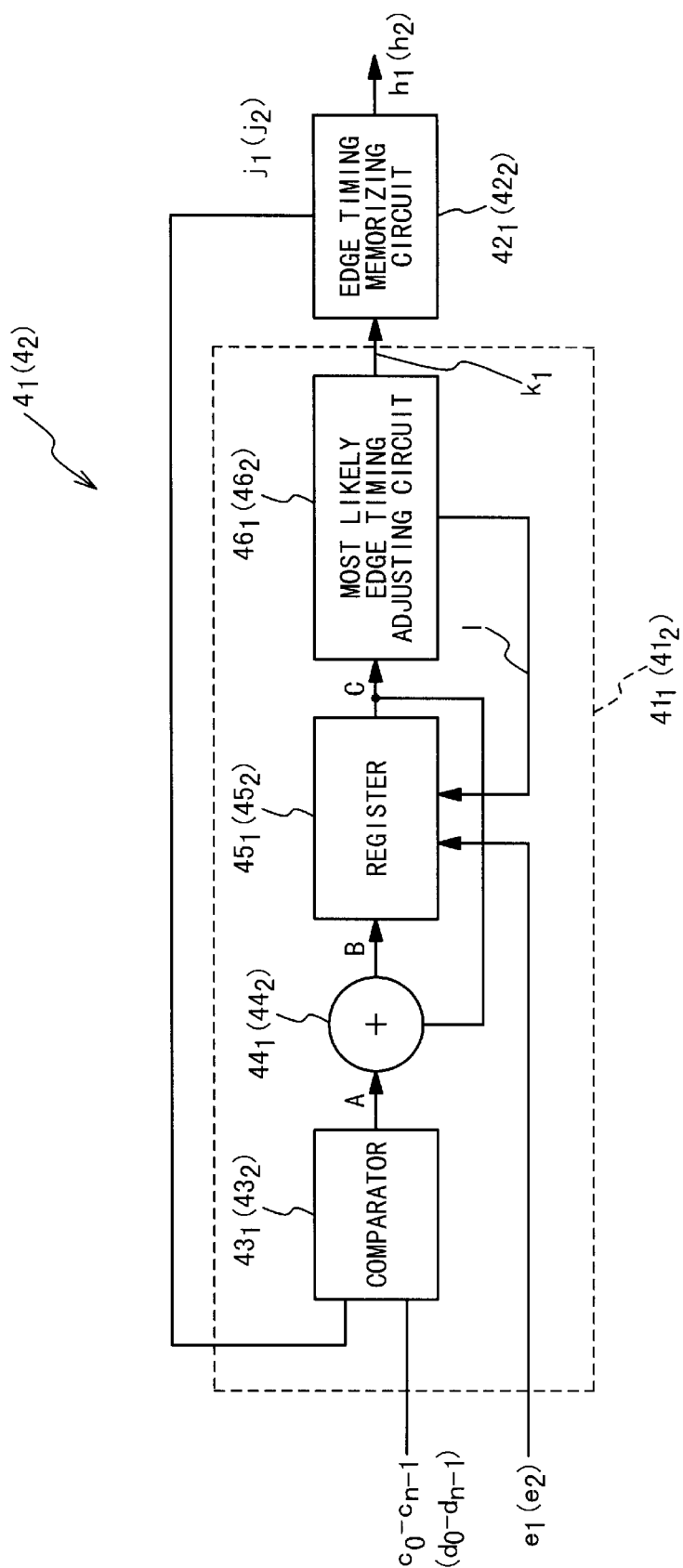
FIG. 8 shows the configurations of an optimized leading edge position calculator $4_1$ and an optimized trailing edge position calculator $4_2$.

FIG. 8 shows the configuration of the most likely leading edge timing calculator $4_1$. As mentioned above, the most likely leading edge timing calculator $4_1$ includes the edge timing comparator $41_1$ and the edge timing memorizing circuit $42_1$. The edge timing comparator $41_1$ includes a comparator $43_1$, an addition circuit $44_1$, a register $45_1$ and a most likely edge timing adjusting circuit $46_1$.

As mentioned above, the edge timing memorizing circuit $42_1$ stores the most likely leading edge timing. The most likely leading edge timing is also quantized to n states in the same way that the leading edge timing detected by the leading edge timing detector $2_1$ is quantized. The most likely leading edge timing is represented by an integer between 0 and n−1.

The register $45_1$ stores an integer value C. The integer value C is deviated larger apart from 0 as a period while the most likely leading edge timing and the detected leading edge timing are different from each other is longer. A positive or negative value of the integer value C indicates whether the detected leading edge timing is temporally located before or after the most likely leading edge timing. The integer value C is referred when the most likely leading edge timing is adjusted.

The leading edge timing signals $c_0$–$c_{n-1}$ indicative of the leading edge timing detected by the leading edge timing detector $2_1$ and a most likely leading edge timing signal $j_1$ indicative of the most likely leading edge timing are inputted to the comparator $43_1$. The comparator $43_1$ compares the leading edge timing with the most likely leading edge timing.

The comparator $43_1$ outputs a comparison output value A on the basis of the compared result. When the leading edge timing is defined as $i_1$ and the most likely leading edge timing is defined as $i_2$, the comparison output value A is determined as follows. If $i_1 < i_2$, the comparator $43_1$ outputs −1 as the comparison output value A. If $i_1 = i_2$, the comparator $43_1$ outputs 0 as the comparison output value A. And, if $i_1 > i_2$, the comparator $43_1$ outputs +1 as the comparison output value A.

The addition circuit $44_1$ adds the comparison output value A and the integer value C held by the register $45_1$ to output an addition value B to the register $45_1$. The register $45_1$ captures the addition value B to replace the integer value C held therein to the addition value B when the edge detection signal $e_1$ is pulled up to the High level. The register $45_1$ outputs the integer value C to the most likely edge timing adjusting circuit $46_1$.

The most likely edge timing adjusting circuit $46_1$ outputs an adjustment instruction signal $k_1$ for instructing to adjust the most likely leading edge timing to the edge timing memorizing circuit $42_1$ in response to the integer value C. When the integer value C reaches a predetermined upper limit, the most likely edge timing adjusting circuit $46_1$ outputs an adjustment instruction signal $k_1$ for instructing to increase the most likely leading edge timing by 1 to the edge timing memorizing circuit $42_1$. Also, when the integer value C reaches a predetermined lower limit, the most likely edge timing adjusting circuit $46_1$ outputs the adjustment instruction signal $k_1$ for instructing to decrease the most likely leading edge timing by 1.

The edge timing memorizing circuit $42_1$ increase or decrease to adjust the most likely leading edge timing stored therein on the basis of the adjustment instruction signal $k_1$.

From the above-mentioned processes, the most likely leading edge timing calculator $4_1$ determines the most likely leading edge of the input signal a, while reducing the influence of the noise and the jitter of the input signal a.

Also, the most likely trailing edge timing calculator $4_2$ determines the most likely trailing edge timing which is most likely for the trailing edge timing of the input signal a on the basis of the latest trailing edge timing detected by the trailing edge timing detector $2_2$.

The most likely trailing edge timing is also quantized to n states in the same way that the trailing edge timing detected by the trailing edge timing detector $2_2$ is quantized, and represented by the integer between 0 and n−1.

The most likely trailing edge timing calculator $4_2$ carries out the following operation. The most likely trailing edge timing is stored in the edge timing memorizing circuit $42_2$. The edge comparator $43_2$ compares the most likely trailing edge timing with the latest trailing edge timing detected by the trailing edge timing detector $2_2$. The most likely trailing edge timing is gradually adjusted.

The most likely trailing edge timing calculator $4_2$ includes an edge timing comparator $41_2$ and an edge timing memorizing circuit $42_2$, as shown in FIG. 8. The edge timing comparator $41_2$ includes a comparator $43_2$, an addition circuit $44_2$, a register $45_2$ and an most likely edge timing adjusting circuit $46_2$. As shown in FIG. 8, the circuit configuration of the most likely trailing edge timing calculator $4_2$ is identical to that of the most likely leading edge timing calculator $4_1$ except for the signals which are inputted to and outputted from the most likely trailing edge timing calculator $4_2$. Also, the operation of the most likely trailing edge timing calculator $4_2$ is identical to that of the most likely leading edge timing calculator $4_1$ except for the signals which are inputted to and outputted from the most likely trailing edge timing calculator $4_2$. Instead of the input of the leading edge timing signals $c_0-c_{n-1}$, the trailing edge timing signals $d_0-d_{n-1}$ are inputted to the most likely trailing edge timing calculator $4_2$. The most likely trailing edge timing calculator $4_2$ adjusts the most likely trailing edge timing stored in the edge timing memorizing circuit $42_2$, on the basis of the trailing edge timing signals $d_0-d_{n-1}$.

The most likely leading edge timing and the most likely trailing edge timing, which are stored in the edge timing memory circuits $42_1$, $42_2$, respectively, are sent to the clock selection circuit 5 on the most likely leading edge timing signal $h_1$ and the most likely trailing edge timing signal $h_2$, respectively.

The clock selection circuit 5 selects the most suitable one for the sampling operation of the input signal a, from among the clock signals $CLK_0-CLK_{n-1}$ on the basis of the most likely leading edge timing and the most likely trailing edge timing. The clock selection circuit 5 selects the one clock signal from the clock signals $CLK_0-CLK_{n-1}$ such that the leading edge timing of the selected clock signal is the closest to the middle between the most likely leading edge timing and the most likely trailing edge timing.

Let us suppose that the selected clock signal is a clock signal $CLK_x$, if $k_1 \geq k_2$, $x=[(k_1+k_2+n)/2]$, if $k_1 < k_2$, $x=[(k_1+k_2)/2]$, where $k_1$ is the most likely leading edge timing, and $k_2$ is the most likely trailing edge timing, and [X] is the Gauss' notation, which implies the maximum integer that does not exceed X.

The clock selection circuit 5 selects one of the clock signals $CLK_0-CLk_{n-1}$ to output a clock selection signal 1 indicative of the selected clock signal $CLK_x$ to the output circuit 6.

The output circuit 6 outputs the selected clock signal $CLK_x$ as a selection clock signal f. Moreover, the output circuit 6 outputs one of the sample signals $b_0$ to $b_{n-1}$ as a data reproduction signal g on the basis of the selection clock signal f. The data reproduction signal g is substantially identical to a signal generated by sampling the input signal a with the selected clock signal. That is, let us suppose that the selected clock is the clock signal $CLK_x$. The output circuit 6 outputs a sample signal $b_x$ among the sample signals $b_0$ to $b_{n-1}$, as the data reproduction signal g. The data reproduction signal g is the signal synchronous with the clock signal $CLK_x$, in which the original waveform of the input signal a is reproduced.

As mentioned above, the apparatus in the embodiment generates the clock signal f synchronous with the input signal a. Moreover, the apparatus samples the input signal a on the basis of the clock signal f, and reproduces the waveform of the input signal a.

In this embodiment, the signal reproducing circuit 3 is operated only when the leading edge and the trailing edge are detected in the input signal a. When the leading edge and the trailing edge are not detected from the input signal a, the signal reproducing circuit 3 is not operated. Thus, the consumption of the electric power is suppressed in the apparatus.

Second Embodiment

Figure 9:
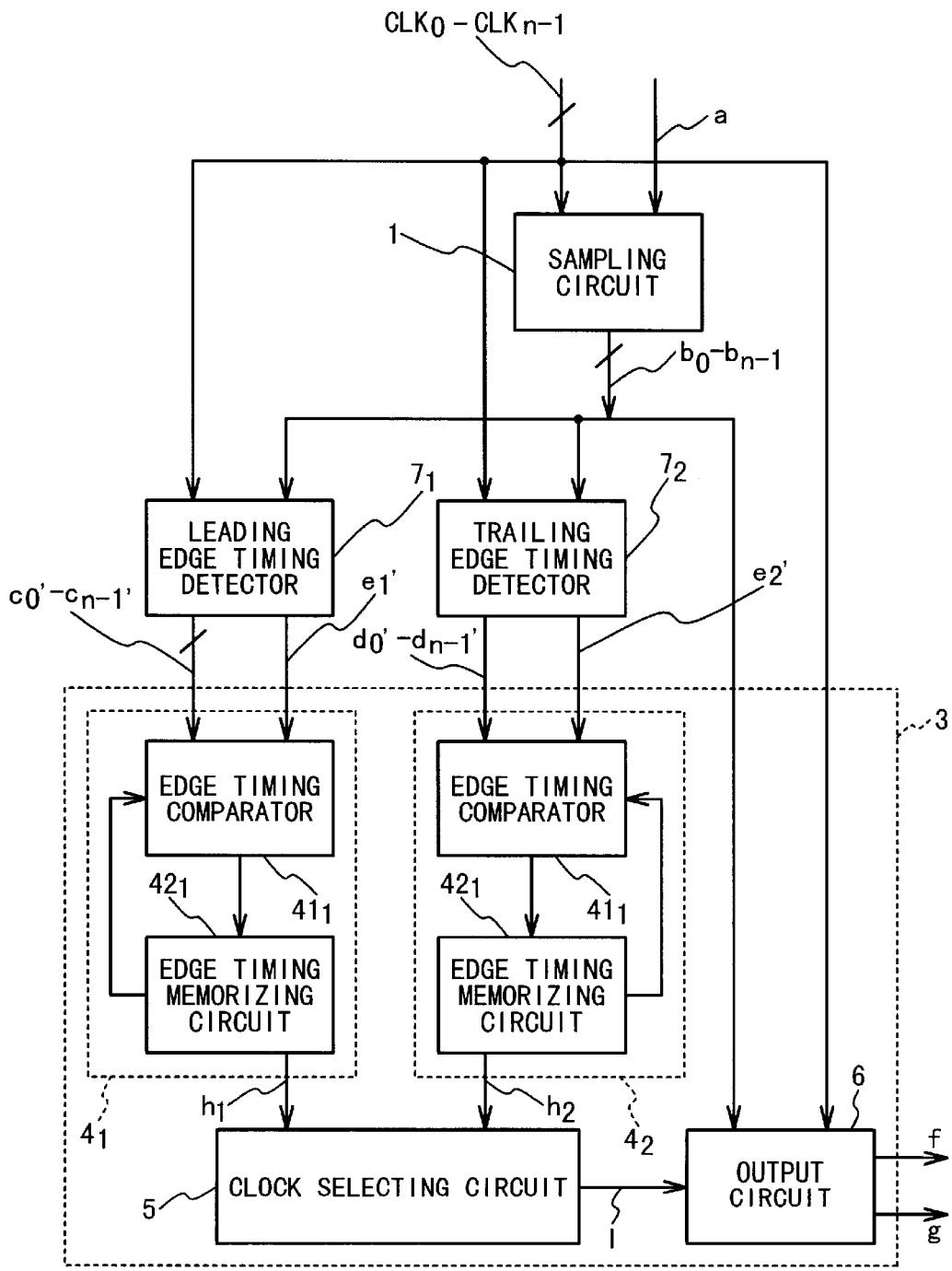
FIG. 9 shows a configuration of a second embodiment according to the present invention.

FIG. 9 shows an apparatus in a second embodiment according to the present invention. The configuration of the apparatus in the second embodiment is identical to that of the apparatus in the first embodiment except for that the leading edge timing detector $2_1$ and the trailing edge timing detector $2_2$ are respectively replaced by a leading edge timing detector $7_1$ and a trailing edge timing detector $7_2$.

The leading edge timing detector $7_1$ detects the leading edge timing of the input signal a to output leading edge timing detection signals $c_0'-c_{n-1}'$ indicative of the leading edge timing of the input signal a.

The leading edge timing detection signals $c_0'-c_{n-1}'$ outputted by the leading edge timing detector $7_1$ are different from the leading edge timing signals $c_0-c_{n-1}$ in the first embodiment. The leading edge timing detection signals $c_0'-c_{n-1}'$ are kept unchanged unless the input signal a rises from the Low level to the High level. That is, the leading edge timing detection signals $c_0-c_{n-1}$ outputted by the leading edge timing detector $2_1$ return back to the Low level in synchronization with the clock signals $CLK_0-CLK_{n-1}$ when the input signal a returns back to the Low level. On the other hand, the states of the leading edge timing detection signals $c_0'-c_{n-1}'$ outputted by the leading edge timing detector $7_1$ are not changed unless the leading edge is detected from the input signal a. This increases the margin of the operational timing of the signal reproducing circuit 3 for capturing and processing the leading edge timing detection signals $c_0'-c_{n-1}'$, and thereby stabilizes the operation of the signal reproducing circuit 3.

Figure 10:
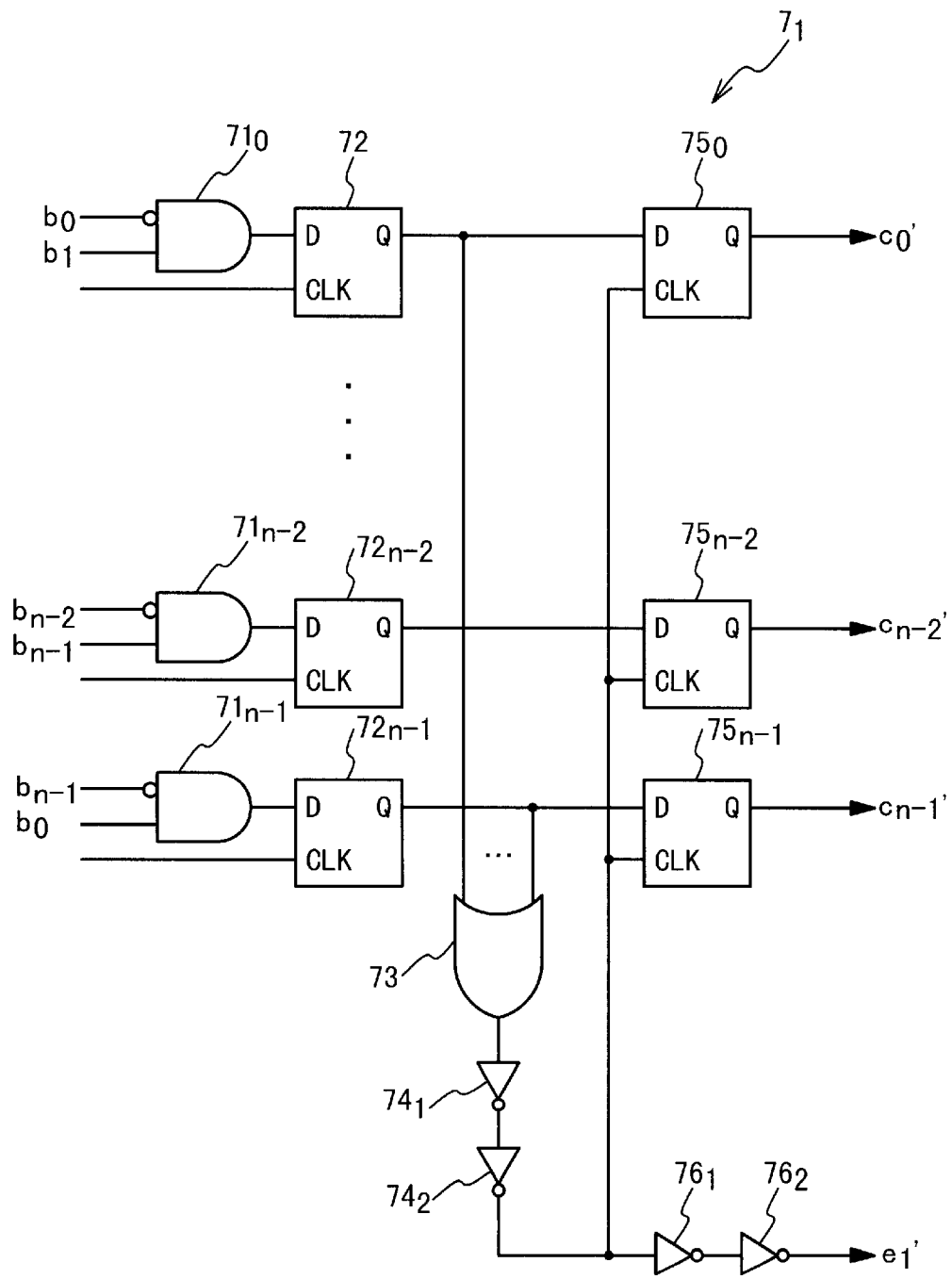
FIG. 10 shows a configuration of a leading edge position detection circuit $7_1$.

FIG. 10 shows the leading edge timing detector $7_1$. The leading edge timing detector $7_1$ includes AND gates $71_0-71_{n-1}$, D-flip-flops $72_0-72_{n-1}$, an OR gate 73, inverters $74_1$, $74_2$, D-flip-flops $75_0-75_{n-1}$ and inverters $76_1$, $76_2$.

An inverse of the sample signal $b_i$ and the sample signal $b_{i+1}$, which are outputted by the sampling circuit 1, are inputted to the AND gate $71_i$. Here, i is the integer between 0 and n−1. For example, in a case of i=0, the sample signal $b_1$ and the inverse of the sample signal $b_0$ are inputted to the AND gate $71_0$. It should be understood that the sample signal $b_n$ means the sample signal $b_0$. That is, the sample signal $b_0$ and the inverse of the sample signal $b_{n-1}$ are inputted to the AND gate $71_{n-1}$. The outputs of the AND gates $71_0$–$71_{n-1}$ are connected to data terminals D of the D-flip-flops $72_0$–$72_{n-1}$, respectively.

The clock signals $CLK_0$–$CLK_{n-1}$ are inputted to clock terminals CLK of the D-flip-flops $72_0$–$72_{n-1}$, respectively. The D-flip-flops $72_0$–$72_{n-1}$ respectively latch the outputs the AND gates $71_0$–$71_{n-1}$ in synchronization with the leading edge of the clock signals $CLK_0$–$CLK_{n-1}$ respectively.

Output terminals Q of the D-flip-flops $72_0$–$72_{n-1}$ are connected to inputs of the OR gate 73. An output of the OR gate 73 is connected to an input of the inverter $74_1$. An output of the inverter $74_1$ is connected to an input of the inverter $74_2$. An output of the inverter $74_2$ is connected to clock terminals CLK of the D-flip-flops $75_0$–$75_{n-1}$.

The inverters $74_1$, $74_2$ delay the signal outputted by the OR gate 73 by a certain delay time so that the D-flip-flops $75_0$–$75_{n-1}$ latch the signals outputted from the output terminals Q of the D-flip-flops $72_0$–$72_{n-1}$ at proper timings.

The data terminals D of the D-flip-flops $75_0$–$75_{n-1}$ are connected to the output terminals Q of the D-flip-flops $72_0$–$72_{n-1}$, respectively. The D-flip-flops $75_0$–$75_{n-1}$ output the leading edge timing detection signals $c_0$, to $c_{n-1}$, from the output terminals Q.

An output of the inverter $74_2$ is connected to an input of the inverter $76_1$. An output of the inverter $76_1$ is connected to an input of the inverter $76_2$. An edge detection signal $e_1'$ is outputted from an output of the inverter $76_2$.

The inverters $76_1$, $76_2$ delay the signal outputted from the inverter $74_2$ by a certain delay time so that the signal reproducing circuit 3 latches the leading edge timing detection signals $c_0'$–$c_{n-1}'$ at proper timings.

The leading edge timing detection signals $c_0'$–$c_{n-1}'$, which is indicative of the leading edge timing of the input signal a, are outputted to the signal reproducing circuit 3.

Figure 11:
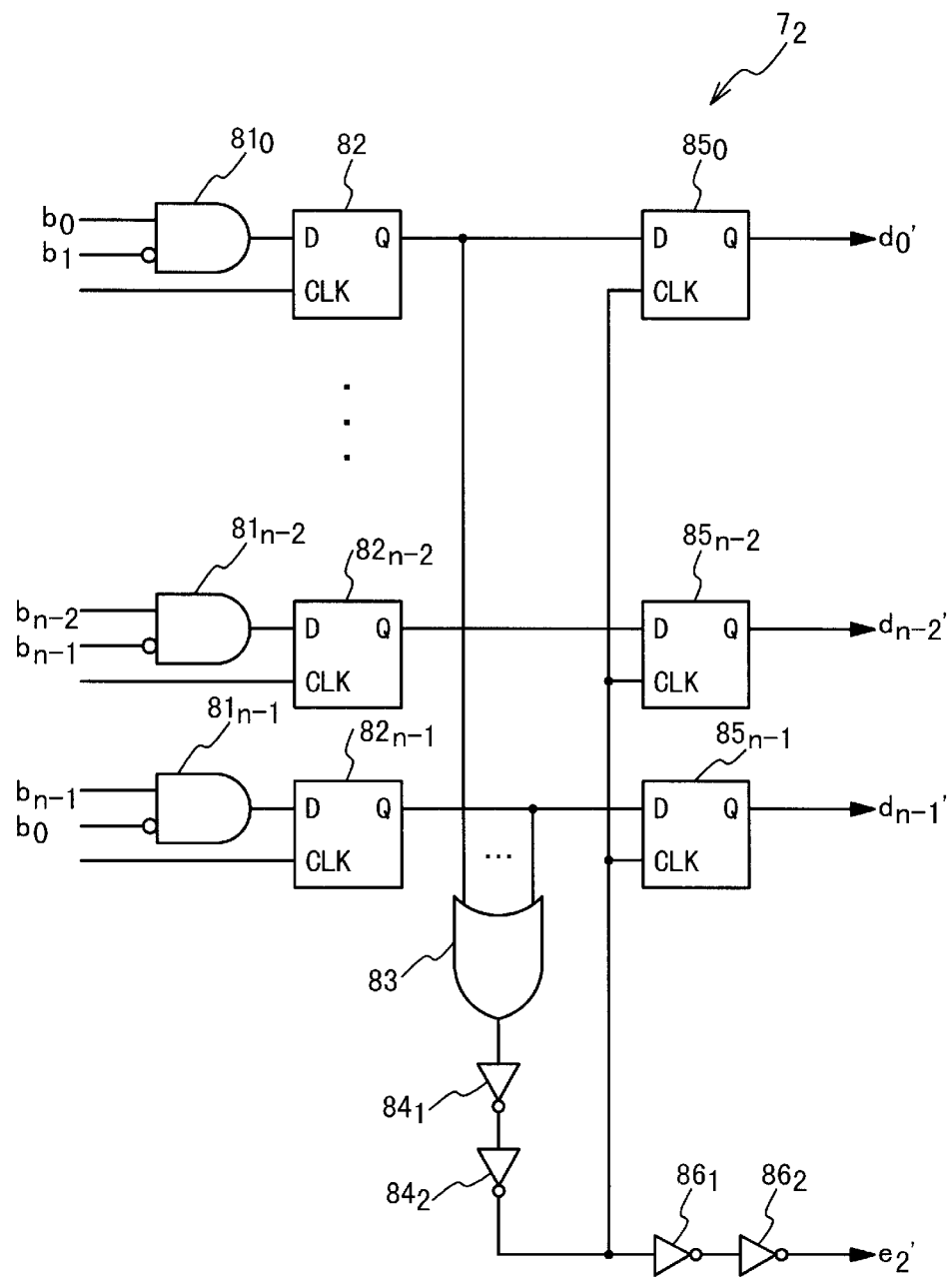
FIG. 11 shows a configuration of a trailing edge position detection circuit $7_2$.

On the other hand, FIG. 11 shows the configuration of the trailing edge timing detector $7_2$. The trailing edge timing detector $7_2$ includes AND gates $81_0$–$81_{n-1}$, D-flip-flops $82_0$–$82_{n-1}$, an OR gate 83, inverters $84_1$, $84_2$, D-flip-flops $85_0$–$85_{n-1}$ and inverters $86_1$, $86_2$.

The trailing edge timing detector $7_2$ has the configuration identical to that of the leading edge timing detector $7_1$ and carries out the operation identical to the respectively except for that the trailing edge timing detector $7_2$ detects the trailing edge timing of the input signal a to generate the trailing edge timing signals $d_0'$–$d_{n-1}'$ indicative of the trailing edge timing. The detailed explanation of the trailing edge timing detector $7_2$ is not provided in the following.

In the apparatus in the second embodiment, the consumption of the electric power is suppressed similarly to the apparatus in the first embodiment. Moreover, the apparatus in the second embodiment is higher in operational stableness than the apparatus in the first embodiment.

As described, the present invention reduces the consumptive electric power of the apparatus that carries out the operation based on the edge timing.

Also, the present invention stabilizes the operation of the apparatus that carries out the operation based on the edge timing.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. An apparatus comprising:
    an edge detecting circuit which detects edges of a non return to zero (NRZ) input signal to generate an edge timing representing signal representative of edge timings of said edges;
    a signal processing circuit responsive to said edge timing representing signal, wherein
    said edge detecting circuit outputs an enable signal to enable said signal processing circuit to operate when said edge detecting circuit finds one of said edges;
    said signal processing circuit executes a signal processing of said edge timing representing signal in response to said enable signal.

2. The apparatus according to claim 1, wherein said edge detecting circuit quantizes said edge timings to represent said edge timings in said edge timing representing signal.

3. The apparatus according to claim 1, wherein said enable signal consists of rectangular pulses having a pulse width larger than a predetermined value.

4. The apparatus according to claim 3, wherein said edge detecting circuit detects said edges in synchronization with a clock signal, and said pulse width is larger than a cycle of said clock.

5. The apparatus according to claim 1, wherein said edge detecting circuit generates said enable signal based on said edge timing representing signal.

6. The apparatus according to claim 1, wherein said edge detecting circuit changes a state of said edge timing representing signal only when said edge detecting circuit detects said edges.

7. The apparatus according to claim 1, wherein said edge detecting circuit includes:
    a plurality of sampling circuits each of which is responsive to one of clock signals for sampling said input signal in synchronization with said one of said clock signals to generate a sample signal, said clock signals having different phases each other, and
    an edge timing determining circuit generates said edge timing representing signal based on said sample signals received from said plurality of sampling circuits, said edge timing determining circuit determining said edge timings on the basis of whether or not two of said sample signals indicate different values.

8. A clock signal reproducing circuit comprising:
    an edge detecting circuit which detects edges of a non return to zero (NRZ) input signal to generate an edge timing representing signal representative of edge timings of said edges;
    a clock signal outputting circuit responsive to said edge timing representing signal for generating another clock signal synchronized with said input signal, wherein
    said edge detecting circuit outputs an enable signal to enable said clock signal outputting circuit to operate when said edge detecting circuit finds one of said edges.

9. The clock signal reproducing circuit according to claim 8, wherein said clock reproducing circuit selects one of a plurality of clock signals having different phases from each other on the basis of said edge timing representing signal and outputs said one of said plurality of clock signals as said another clock signal.

10. The clock signal reproducing circuit according to claim 8, wherein said edges have a present edge which is latest of said edges, and a past edge detected before said present edge, and said clock signal outputting circuit includes:

a memorizing circuit memorizing a past edge timing of said past edge, said another clock signal is outputted on the basis of edge timings of said present edge and said past edge.

11. A signal reproducing circuit comprising:

an edge detecting circuit which detects edges of a non return to zero (NRZ) input signal to generate an edge timing representing signal representative of edge timings of said edges;

a clock signal outputting circuit responsive to said edge timing representing signal for generating another clock signal synchronized with said input signal; and a reproduced signal outputting circuit sampling said input signal with said another clock signal to output a reproduced signal, wherein said edge detecting circuit outputs an enable signal to enable said clock signal outputting circuit to operate when said edge detecting circuit finds on of said edges.

12. A signal reproducing circuit comprising:

detecting edges of a non return to zero (NRZ) input signal;

outputting an edge timing representing signal representative of edge timings of said edges;

outputting an enable signal when one of said edges is detected; and enabling a circuit to operate in response to said edge timing representing signal.

13. The method according to claim 12, wherein said circuit outputs a clock signal synchronized with said input signal on the basis of said edge timings.

* * * * *